US012805281B2

(12) United States Patent
He et al.

(10) Patent No.: US 12,805,281 B2
(45) Date of Patent: Nov. 17, 2026

(54) FULLY ALIGNED VIA INTEGRATION WITH SELECTIVE CATALYZED VAPOR PHASE GROWN MATERIALS

(71) Applicant: Samsung Electronics Co., Ltd., Gyeonggi-do (KR)

(72) Inventors: Ming He, San Jose, CA (US); Harsono Simka, Saratoga, CA (US); Rebecca Park, Menlo Park, CA (US)

(73) Assignee: Samsung Electronics Co., Ltd (KR)

( * ) Notice: Subject to any disclaimer, the term of this patent is extended or adjusted under 35 U.S.C. 154(b) by 713 days.

(21) Appl. No.: 18/332,149

(22) Filed: Jun. 9, 2023

(65) Prior Publication Data

US 2023/0317513 A1 Oct. 5, 2023

Related U.S. Application Data

(62) Division of application No. 17/326,973, filed on May 21, 2021, now Pat. No. 11,705,363.

(60) Provisional application No. 63/163,378, filed on Mar. 19, 2021.

(51) Int. Cl.
*H10W 20/00* (2026.01)
*H10W 20/42* (2026.01)

(52) U.S. Cl.
CPC ....... *H10W 20/088* (2026.01); *H10W 20/056* (2026.01); *H10W 20/076* (2026.01); *H10W 20/42* (2026.01)

(58) Field of Classification Search
CPC . H10W 20/076; H10W 20/088; H10W 20/42; H10W 20/056; H10W 20/0554; H10W 20/4462; H10W 40/25
See application file for complete search history.

(56) References Cited

U.S. PATENT DOCUMENTS

| | | | | |
|---|---|---|---|---|
| 6,709,918 | B1 * | 3/2004 | Ng | H10D 1/47 438/959 |
| 9,343,356 | B2 | 5/2016 | Kuo et al. | |
| 10,354,955 | B2 | 7/2019 | Lu et al. | |
| 10,395,986 | B1 | 8/2019 | Briggs et al. | |
| 10,396,026 | B2 | 8/2019 | Wei et al. | |
| 10,770,392 | B1 | 9/2020 | Licausi et al. | |

(Continued)

FOREIGN PATENT DOCUMENTS

| | | |
|---|---|---|
| JP | 2012-059983 | 3/2012 |
| JP | 2013-219203 | 10/2013 |
| WO | WO 2008/149548 | 8/2010 |

OTHER PUBLICATIONS

Korean Office Action dated Jun. 29, 2025 issued in counterpart application No. 10-2022-0006734, 2 pages.

(Continued)

*Primary Examiner* — John M Parker

(74) *Attorney, Agent, or Firm* — The Farrell Law Firm, P.C.

(57) ABSTRACT

A method and electronic device are provided. The electronic device includes a first dielectric layer; a metal patterned in the first dielectric layer; a second dielectric layer deposited on the first dielectric layer; and a metal via deposited in a channel in the second dielectric layer, the metal via being in contact with the patterned metal in the first dielectric layer. The channel is formed by removing at least a portion of a nanowall formed on the metal in the first dielectric layer.

14 Claims, 8 Drawing Sheets

(56) References Cited

U.S. PATENT DOCUMENTS

| | | | | |
|---|---|---|---|---|
| 10,867,913 | B2 | 12/2020 | Wu et al. | |
| 2006/0088975 | A1* | 4/2006 | Ueda | H10W 20/071 438/421 |
| 2008/0224115 | A1 | 9/2008 | Bakkers | |
| 2011/0057322 | A1 | 3/2011 | Matsunaga | |
| 2012/0049370 | A1 | 3/2012 | Wada | |
| 2015/0279747 | A1 | 10/2015 | Kondo | |
| 2020/0144117 | A1 | 5/2020 | Parikh | |
| 2021/0013146 | A1 | 1/2021 | Wang et al. | |
| 2021/0098290 | A1 | 4/2021 | Hsueh | |

OTHER PUBLICATIONS

Seidl, J. et al., "Regaining a spatial dimension: Mechanically transferrable two-dimensional InAs nanofins grown by selective area epitaxy", arXiv:1907.00134v1 [cond-mat.mes-hall] Jun. 29, 2019, pp. 36.

Schmidt, V. et al., "Growth, Thermodynamics, and Electrical Properties of Silicon Nanowires", Copyright 2010 American Chemical Society, Chem. Rev. 2010, 110, 361-388.

* cited by examiner

600

FULLY ALIGNED VIA INTEGRATION WITH SELECTIVE CATALYZED VAPOR PHASE GROWN MATERIALS

PRIORITY

This application is a divisional of U.S. Ser. No. 17/326,973, which was filed in the U.S. Patent and Trademark Office on May 21, 2021, and is based on and claims priority under 35 U.S.C. § 119(e) to U.S. Provisional Patent Application Ser. No. 63/163,378, filed on Mar. 19, 2021, the entire contents of each of which are incorporated herein by reference.

FIELD

The present disclosure is generally related to advanced logic technology scaling in back-end-of-line (BEOL) interconnect.

BACKGROUND

Advanced logic technology scaling is limited by reliability issues, particularly time-dependent dielectric breakdown, when a device is smaller and metal-to-metal spacing is below 20 nm, resulting in serious time-dependent dielectric breakdown (TDDB) and expensive fab manufacture control.

SUMMARY

According to one embodiment, a method includes patterning a metal in a first dielectric layer, depositing a first metal layer over the patterned metal, forming a nanowall under the first metal layer such that the nanowall is in contact with the patterned metal in the first dielectric layer, depositing a second dielectric layer on the first dielectric layer, removing at least a portion of the nanowall, thereby forming a channel in the second dielectric layer, and depositing a metal via in the channel such that the metal via is in contact with the patterned metal in the first dielectric layer.

According to one embodiment, an electronic device includes a first dielectric layer, a metal patterned in the first dielectric layer, a second dielectric layer deposited on the first dielectric layer, a third dielectric layer deposited on the second dielectric layer, and a metal via deposited in a channel in the second dielectric layer and a space in the third dielectric layer, the metal via in contact with the patterned metal in the first dielectric layer. The channel is formed by removing at least a portion of a nanowall formed on the metal in the first dielectric layer.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1B:
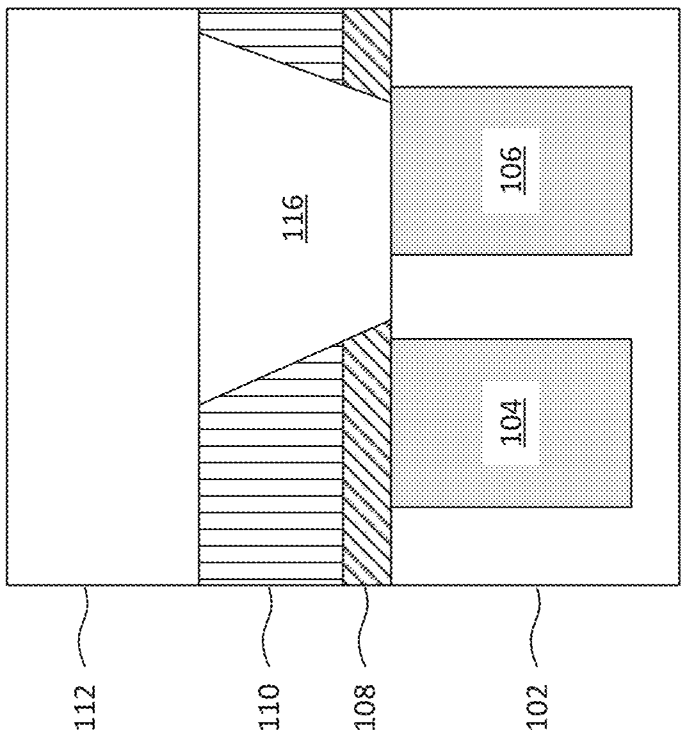
FIGS. 1A and 1B illustrate diagrams of semiconductor device structures.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

Figure 1A:
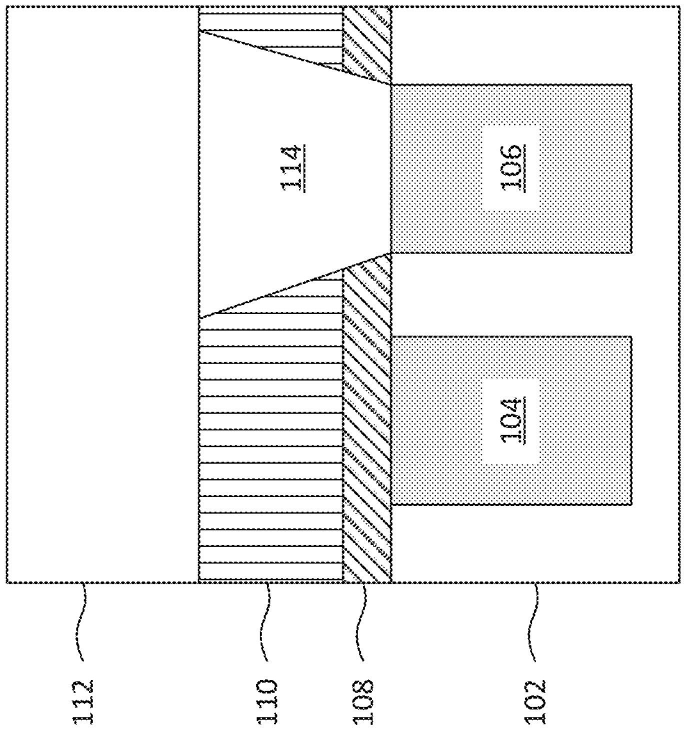

FIGS. 1A and 1B illustrate diagrams of semiconductor device structures. The semiconductor device structures include a first interlayer dielectric (ILD) layer 102, a first metal 104 and a second metal 106 formed into the ILD layer 102, a cap dielectric layer 108 disposed on the first metal 104, second metal 106 and the ILD layer 102. The electronic device structures include a second ILD layer 110 is disposed on the cap dielectric layer 108, and a metal layer 112 is disposed on the second ILD layer 110. A metal via 114 is etched into the second ILD layer 110 and the cap dielectric layer 108 to contact the second metal 104.

FIG. 1A shows an ideal scenario with minimal overlay error between the metal via 114, the second metal 106 and the ILD layer 102. FIG. 1B shows a scenario with overlay error between the metal via 116 and the second metal 106. Due to overlay error between the metal via 116 and the second metal 106, as well as critical dimension (CD) variations in the metal via 116 and the second metal 104, the bottom of the metal via 116 may come close to the first metal 104 underneath, creating reliability concerns on TDDB. This limits logic scaling in below 20 nm pitch dimension.

Figure 2:
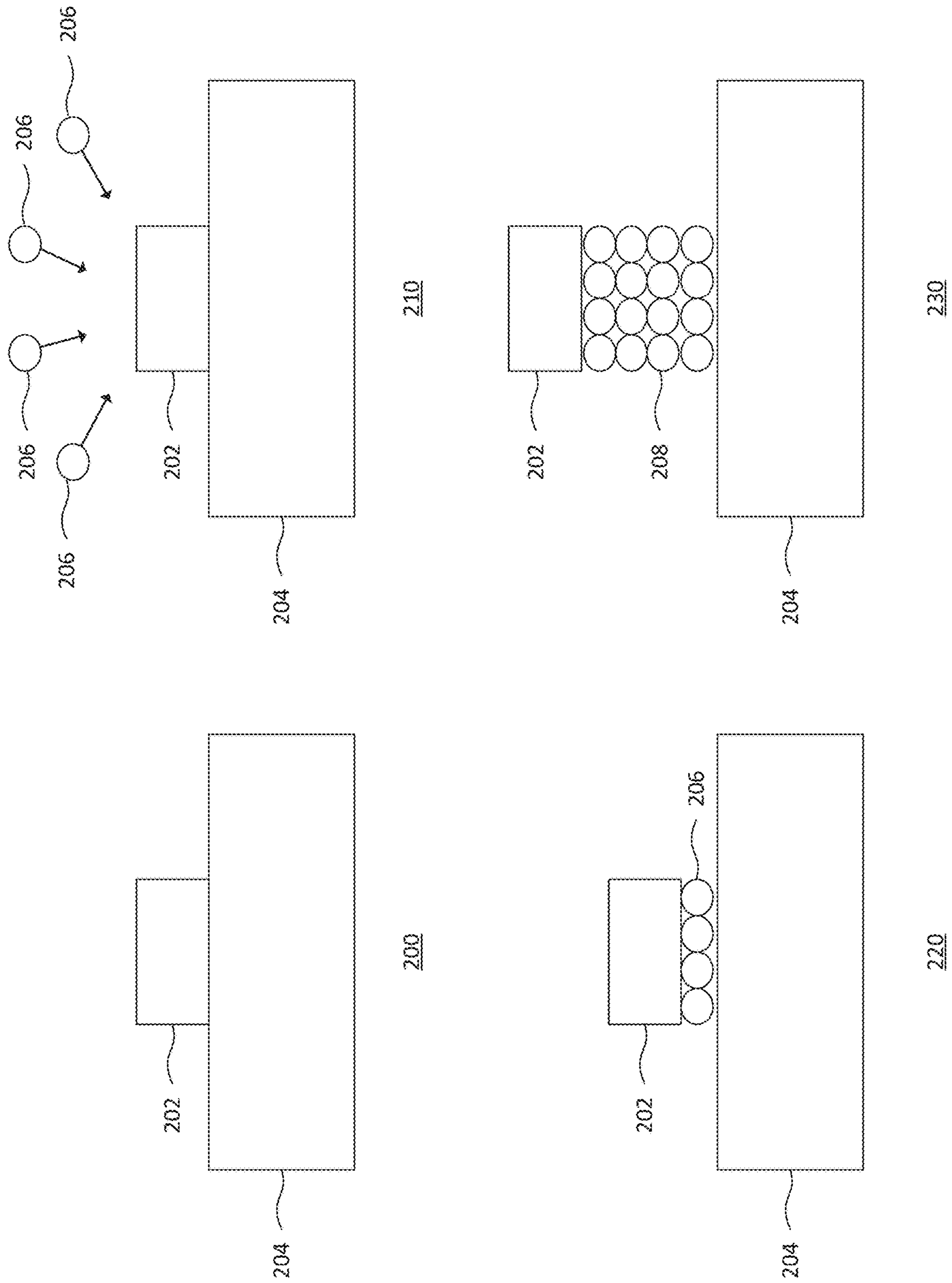
FIG. 2 illustrates a diagram of a vapor-liquid-solid (VLS) growth method, according to an embodiment.

FIG. 2 illustrates a diagram of a VLS growth method, according to an embodiment. The VLS method may be used to create selective depositions for BEOL interconnect patterning applications, as described herein. As an example, at 200, a nanoparticle or patterned nanofilm 202 (e.g., Au) is deposited on a wafer 204 (e.g., Si wafer). A catalyst, such as H2, is introduced to a silicon based material, which reduces silane gas into Si vapor. In one example, SiH4 gas self-decomposition is utilized at elevated temperature on an Au surface, the reaction byproduct H2 is vaporized, and Si diffuses into Au, forming a liquid phase alloy. When there is sufficient Si inside Au, it reaches its supersolubility limit at the deposition temperature, and the Si starts to precipitate out of the Au at the bottom of the nanofilm 202, where it forms a solid silicon nanowire or nanowall. At 210, the Si vapor 206 is introduced to the deposited nanoparticle or patterned nanofilm 202. At 220, the Si vapor 206 is diffused through droplets of the nanoparticle deposition 202. At 230, the nanoparticle deposition 202 is super saturated with Si, causing selective precipitation, forming silicon nanowires or nanowalls 208.

More particularly, the VLS method shown in FIG. 2 may be used to create selective deposition in a BEOL interconnect structure. VLS can create tall (>um) and very straight profiles of nanowires and/or nanowalls, with excellent selectivity (e.g., catalyst driven). For example, this allows for improved, if not fully-aligned, via integration. It also avoids a metal recess step, which conventionally adds manufacture strain on the metal gap fill in high aspect-ratio structures. VLS has not previously been utilized for selective deposition in a BEOL interconnect structure.

Figure 3A:
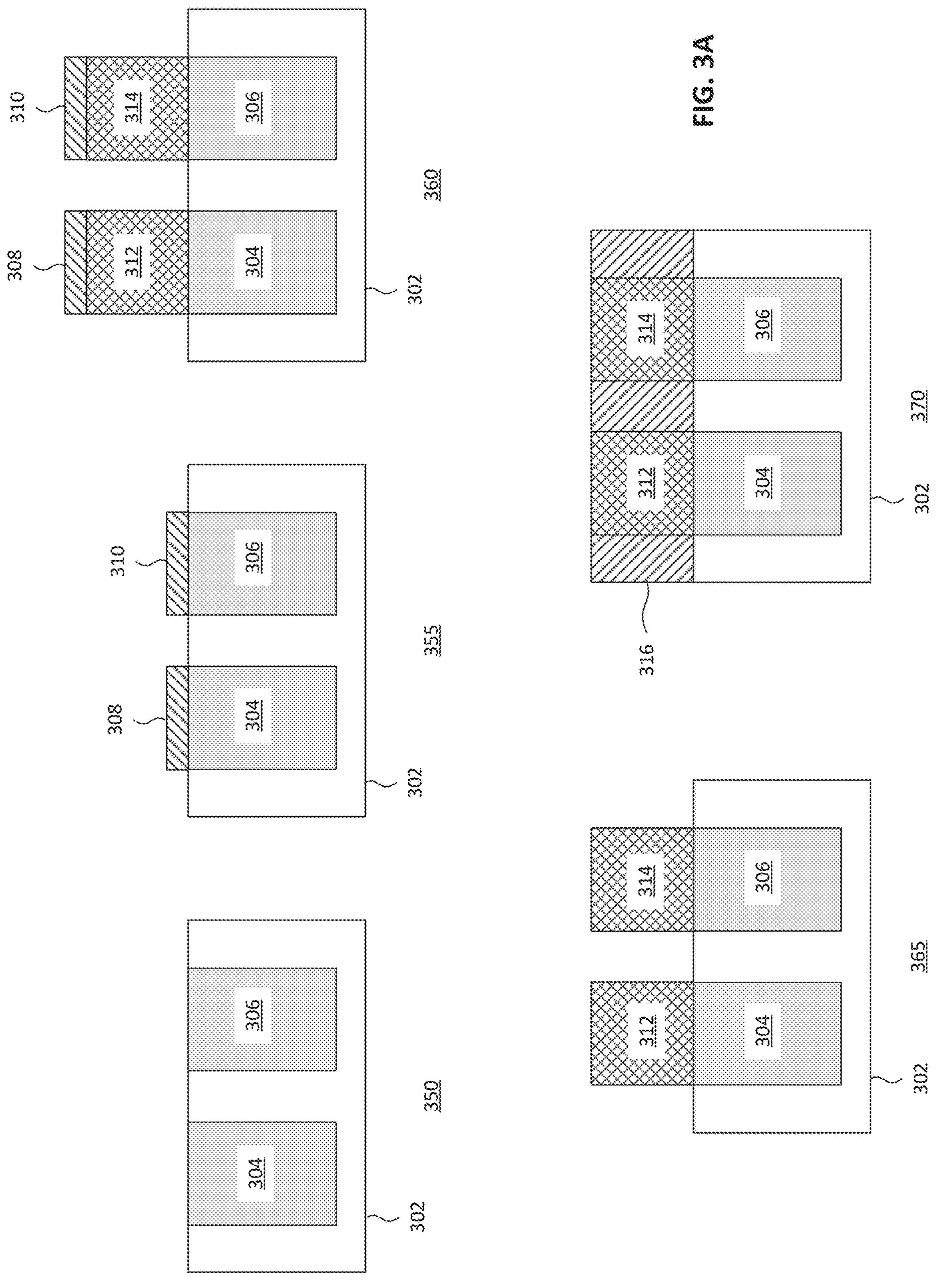
FIGS. 3A and 3B illustrate diagrams of an electronic device formation process, according to an embodiment.
Figure 3B:
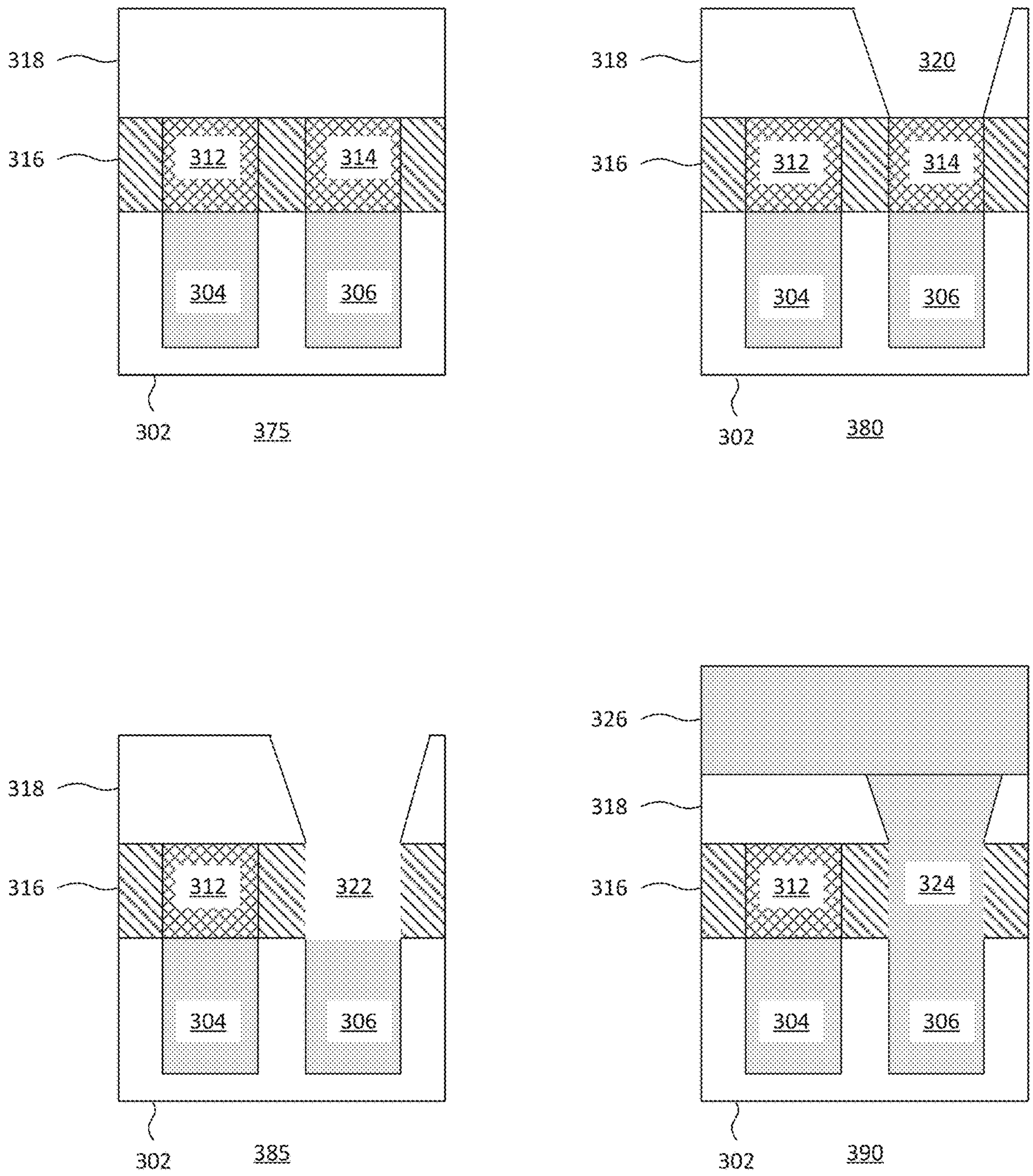

FIGS. 3A and 3B illustrate diagrams of an electronic device formation process, according to an embodiment. Referring to FIG. 3A, at 350, the electronic device includes a first ILD layer 302, a first metal 304 patterned in the ILD layer 302 and a second metal 306 patterned in the ILD layer. At 355, a first thin metal layer 308 may be deposited over the first metal 304 and a second thin metal layer 310 is deposited over the second metal 306. The thickness of the first and second thin metal layers 308 and 310 may range from about 2 nm to about 5 nm layers and the metal layers 308 and 310 may be Co, Ru, Au, etc. This layer can be deposited using selective chemical vapor deposition (CVD) method. It is a technology to deposit thin metal layer, but typically loses selectivity over 10 nm thickness. Other dielectric catalysis may be used as the thin metal layers 308 and 310. At 360, dielectric nanowalls 312 and 314 are grown under the metal layers 308 and 310, respectively via metal catalyst assisted VLS, grown as described above. The dielectric nanowalls 312 and 314 may be formed such that they are in contact with the first metal 304 and the second metal 306, respectively. The materials for the dielectric nanowalls 312 and 314 may include SiO2, SiN, etc. The thickness of the dielectric nanowalls 312 and 314 may range from about 5 nm to about 50 nm, and can be independently selected based on the end structure to be created, and does not depend on the dimensions (e.g., widths and thicknesses) of the underlying structures 304 and 306. At 365, the thin metal layers 308 and 310 are removed. Layers 308 and 310 may be removed by wet etching with, for example, H2O2 or HF, or by reactive ion etching (RIE) using Cl2 based chemistry for Co, or O2 based plasma for Ru. At 370, a dielectric layer 316 is disposed on the first ILD layer 302 and between the nanowalls 312 and 314, and at a thickness similar to the thickness of the nanowalls 312 and 314, and the top surface may be planarized by chemical mechanical planarization (CMP). The dielectric layer 316 may be SiN when the first ILD layer 302 is SiO2 or SiCO, and the dielectric layer 316 may be SiO2 or SiCO when the first ILD layer 302 is SiN.

Referring to FIG. 3B, at 375, a second ILD layer 318 is deposited on the dielectric nanowalls 312 and 314, and the dielectric layer 316. At 380, a via space 320 is etched away from the second ILD layer 318 above the dielectric nanowall 314. At 385, a portion of the dielectric nanowall 314 that is openly exposed under the space 320 is selectively etched away (e.g., by reactive ion etch) from the structure, leaving a channel 322 through the second ILD layer 318 and the dielectric layer 316 to a surface of the second metal 306. At 390, a metal via 324 is selectively deposited in the channel 322 via the space 320, and a metal layer 326 is deposited on the second ILD layer 318 and metal via 324, such that the second metal 306 is in contact with the metal layer 326. The process depicted in FIGS. 3A and 3B provides a more reliable connection between the metal layer 326 and the second metal 306, and reduces the risk of contact between the etched metal 324 and the first metal 304.

Figure 4A:
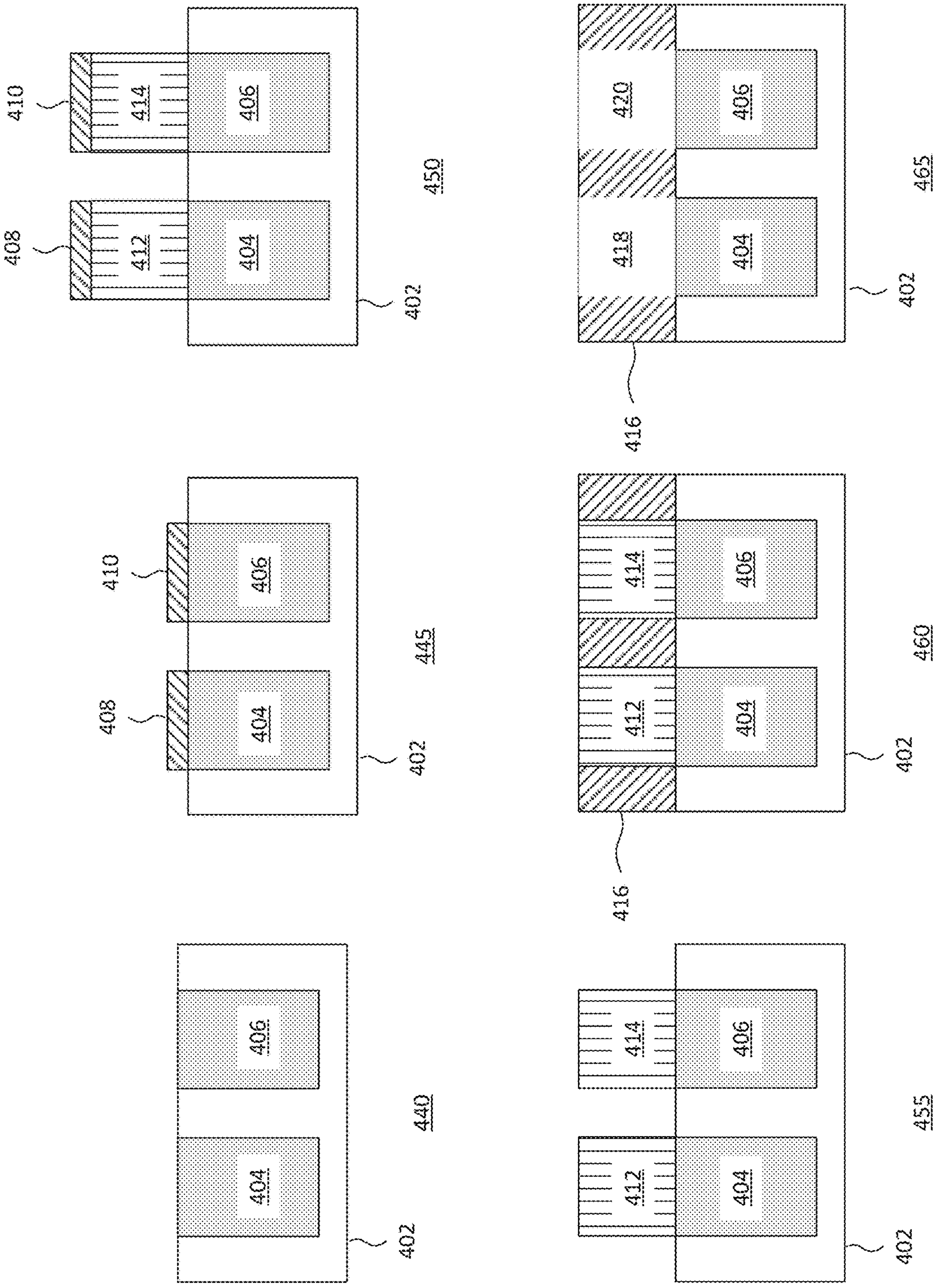
FIGS. 4A and 4B illustrate diagrams of an electronic device formation process, according to an embodiment.
Figure 4B:
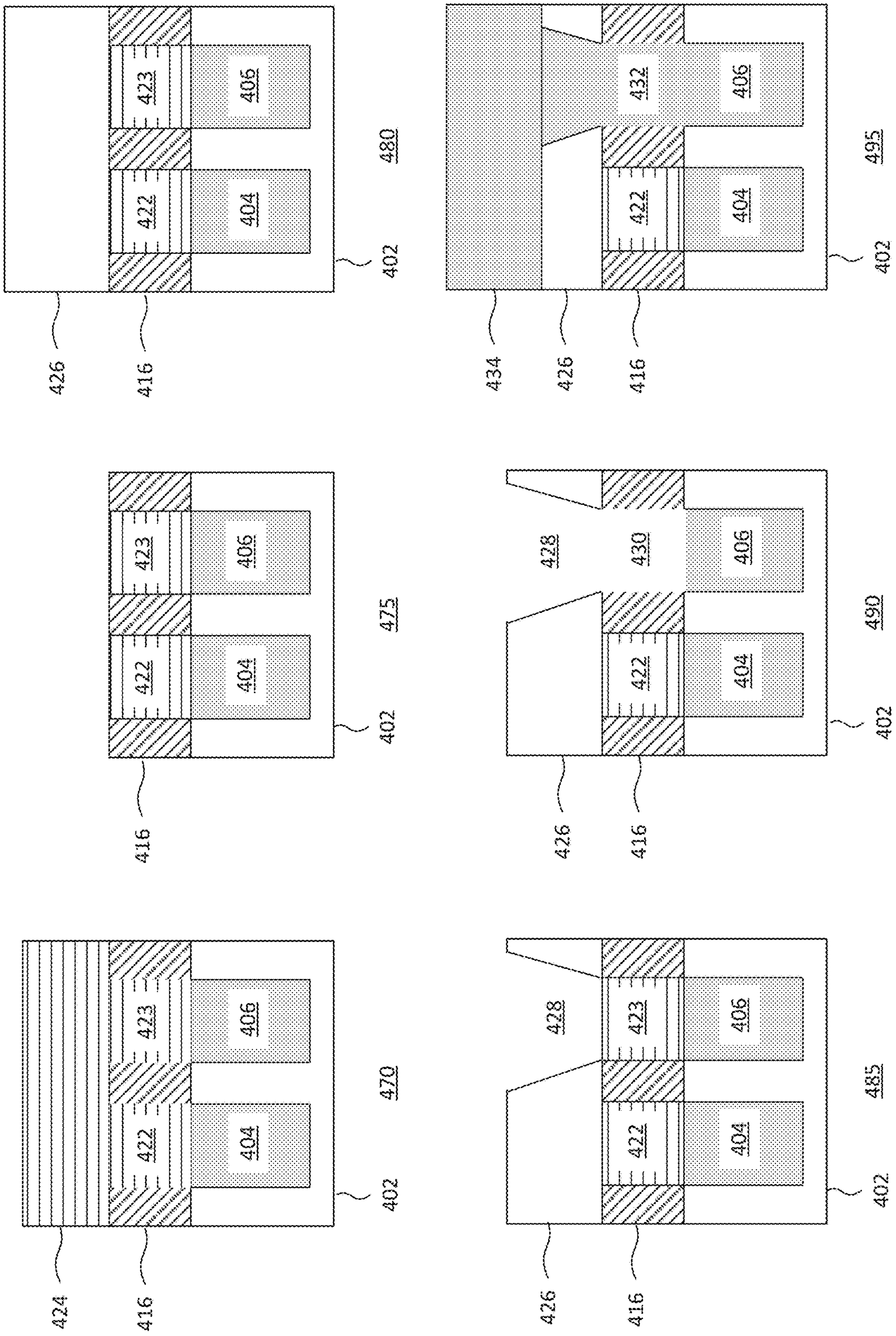

FIGS. 4A and 4B illustrate diagrams of an electronic device formation process, according to an embodiment. Referring to FIG. 4A, at 440, the electronic device includes a first ILD layer 402, a first metal 404 patterned in the ILD layer 402 and a second metal 406 patterned in the ILD layer. At 445, a first thin metal layer 408 is deposited over the first metal 404 and a second thin metal layer 410 is deposited over the second metal 406. The thickness of the first and second thin metal layers 408 and 410 may range from about 2 nm to about 5 nm layers and the metal layers 408 and 410 may be Co, Ru, Au, etc. This layer can be deposited using selective chemical vapor deposition (CVD) method which is already used in semiconductor manufacture industry. It is a mature technology to deposit thin metal layer, but typically lose selectivity over 10 nm thickness. Other dielectric catalysis may be used as the thin metal layers 408 and 410. At 450, semiconductor nanowalls 412 and 414 are grown under the metal layers 408 and 410, respectively via metal catalyst assisted VLS grown described above. The semiconductor nanowalls 412 and 414 are formed such that they are in contact with the first metal 404 and the second metal 406, respectively. The materials for the dielectric nanowalls 412 and 414 may include $SiO_2$, SiN, etc. The thickness of the dielectric nanowalls 412 and 414 may range from about 5 nm to about 50 nm, and can be independently selected based on the end structure to be created, and does not depend on the dimensions (e.g., widths and thicknesses) of the underlying structures 404 and 406. At 455, the thin metal layers 408 and 410 are removed. Layers 408 and 410 may be removed by wet etching with, for example, $H_2O_2$ or HF, or by RIE using $Cl_2$ based chemistry for Co, or $O_2$ based plasma for Ru. At 460, a dielectric layer 416, is disposed on the first ILD layer 402 and between the nanowalls 412 and 414, and use CMP to polish down to the same thickness similar to the thickness of the nanowalls 412 and 414. At 465, the semiconductor nanowalls 412 and 414 are removed. The semiconductor nanowalls 412 and 414 may be selectively etched away from the dielectric layer 416, leaving channels 418 and 420 above the first metal 404 and second metal 406, respectively.

Referring to FIG. 4B, at 470, a dielectric material 422 and 423, such as SiN or a material that is different from dielectric layer 416, is disposed in the channels 418 and 420, and also forms a layer 424 above the dielectric layer 416. At 475, the layer 424 is removed, and chemical mechanical polishing (CMP) may be performed on the remaining surface. At 480, a second ILD layer 426 is disposed over the dielectric material in channels 418 and 420 and the dielectric layer 416. The dielectric layer 422 may be SiN when the second ILD layer 426 is $SiO_2$ or SiCO or a low-k dielectric (e.g., SiCOH), and the dielectric layer 416 may be $SiO_2$ or SiCO or a low-k dielectric (e.g., SiCOH) when the second ILD layer 426 is SiN. At 485, a space 428 is etched away from the second ILD layer 426 above the dielectric material in the channel 420. At 490, the dielectric material 423 or a portion of the dielectric material 423 in the channel 420 is selectively etched away (e.g., by CMP) from the structure, leaving a channel 430 through the second ILD layer 426 and the dielectric layer 416 to a surface of the second metal 406. At 495, a metal via 432 is selectively deposited in the channel 430 via the space 430, and a metal layer 434 is deposited on the second ILD layer 426 and metal via 432, such that the second metal 406 is in contact with the metal layer 434. The process depicted in FIGS. 4A and 4B provides a more reliable connection between the metal layer 434 and the second metal 406, and reduces the risk of contact between metal via 432 and the first metal 404.

Figure 5:
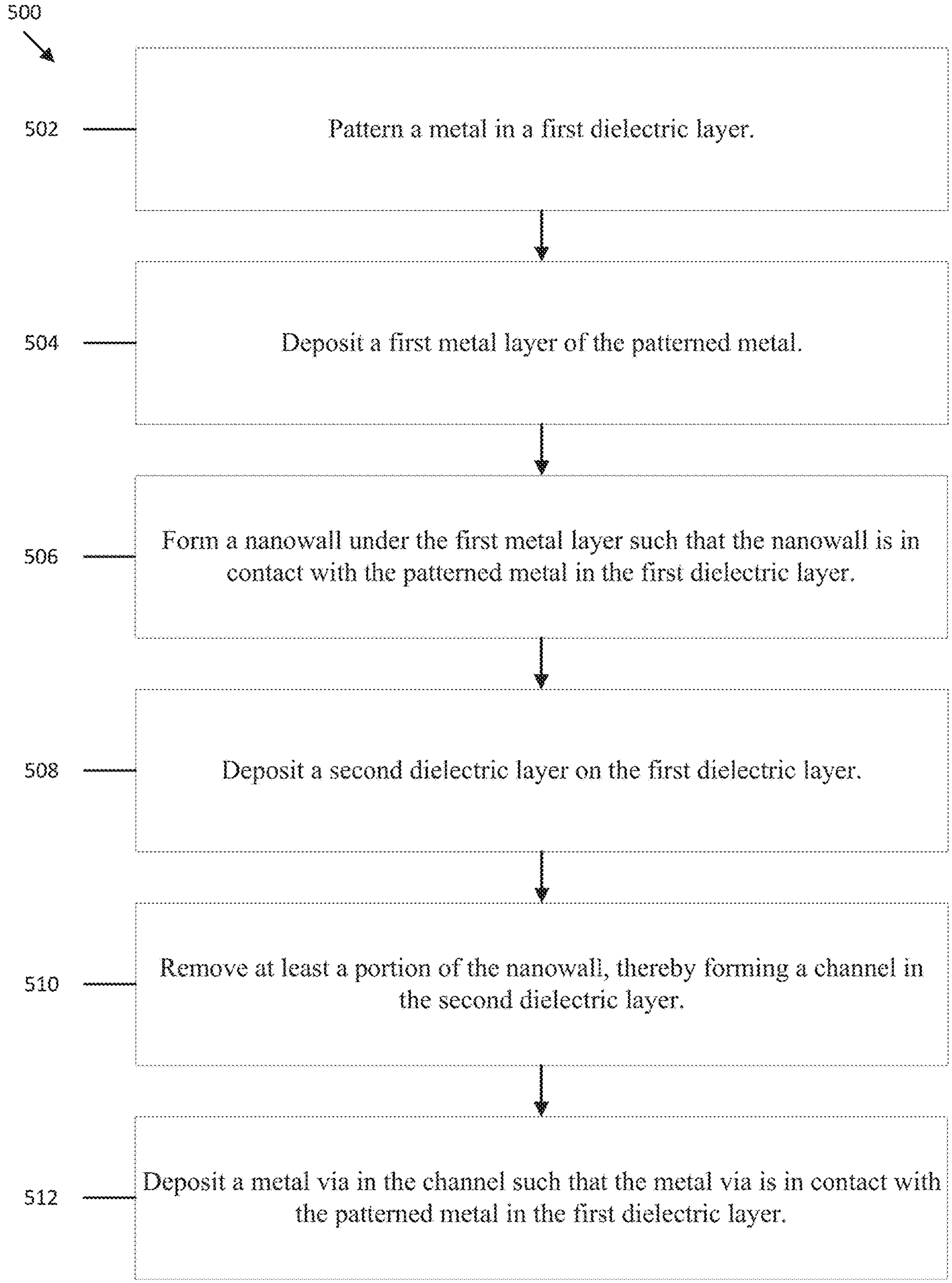
FIG. 5 illustrates a flowchart for a method of forming an electronic device, according to an embodiment.

FIG. 5 illustrates a flowchart 500 for a method of forming an electronic device, according to an embodiment. At 502, a metal is patterned in a first dielectric layer. At 504, a first metal layer is selectively deposited on the patterned metal. At 506, a nanowall is formed under the first metal layer such that the nanowall is in contact with the patterned metal in the first dielectric layer. At 508, a second dielectric layer is deposited on the first dielectric layer. At 510, at least a portion of the nanowall is removed, thereby forming a channel in the second dielectric layer. At 512, a metal via is deposited in the channel such that the metal via is in contact with the patterned metal in the first dielectric layer.

Figure 6:
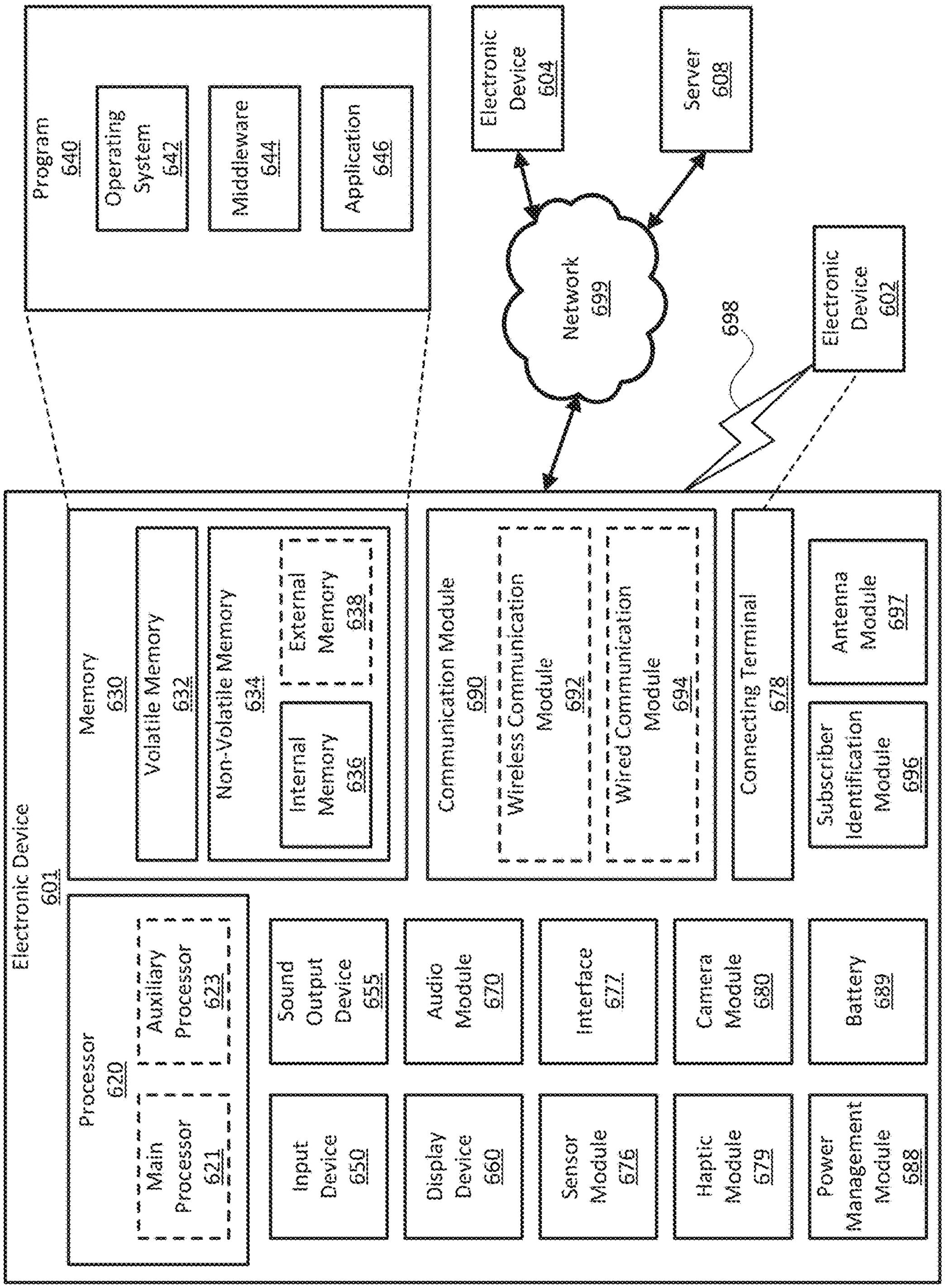
FIG. 6 illustrates a block diagram of an electronic device in a network environment, according to one embodiment.

FIG. 6 illustrates a block diagram of an electronic device 601 in a network environment 600, according to one embodiment. Referring to FIG. 6, the electronic device 601 in the network environment 600 may communicate with an electronic device 602 via a first network 698 (e.g., a short-range wireless communication network), or an electronic device 604 or a server 608 via a second network 699 (e.g., a long-range wireless communication network). The electronic device 601 may communicate with the electronic device 604 via the server 608. The electronic device 601 may include a processor 620, a memory 630, an input device 650, a sound output device 655, a display device 660, an audio module 670, a sensor module 676, an interface 677, a haptic module 679, a camera module 680, a power management module 688, a battery 689, a communication module 690, a subscriber identification module (SIM) 696, or an antenna module 697. In one embodiment, at least one (e.g., the display device 660 or the camera module 680) of the components may be omitted from the electronic device 601, or one or more other components may be added to the electronic device 601. In one embodiment, some of the components may be implemented as a single integrated circuit (IC). For example, the sensor module 676 (e.g., a fingerprint sensor, an iris sensor, or an illuminance sensor) may be embedded in the display device 660 (e.g., a display).

The processor 620 may execute, for example, software (e.g., a program 640) to control at least one other component (e.g., a hardware or a software component) of the electronic device 601 coupled with the processor 620, and may perform various data processing or computations. As at least part of the data processing or computations, the processor 620 may load a command or data received from another component (e.g., the sensor module 676 or the communication module 690) in volatile memory 632, process the command or the data stored in the volatile memory 632, and store resulting data in non-volatile memory 634. The processor 620 may include a main processor 621 (e.g., a central processing unit (CPU) or an application processor (AP)), and an auxiliary processor 623 (e.g., a graphics processing unit (GPU), an image signal processor (ISP), a sensor hub processor, or a communication processor (CP)) that is operable independently from, or in conjunction with, the main processor 621. Additionally or alternatively, the auxiliary processor 623 may be adapted to consume less power than the main processor 621, or execute a particular function. The auxiliary processor 623 may be implemented as being separate from, or a part of, the main processor 621.

The auxiliary processor 623 may control at least some of the functions or states related to at least one component (e.g., the display device 660, the sensor module 676, or the communication module 690) among the components of the electronic device 601, instead of the main processor 621 while the main processor 621 is in an inactive (e.g., sleep) state, or together with the main processor 621 while the main processor 621 is in an active state (e.g., executing an application). According to one embodiment, the auxiliary processor 623 (e.g., an image signal processor or a communication processor) may be implemented as part of another component (e.g., the camera module 680 or the communication module 690) functionally related to the auxiliary processor 623.

The memory 630 may store various data used by at least one component (e.g., the processor 620 or the sensor module 676) of the electronic device 601. The various data may include, for example, software (e.g., the program 640) and input data or output data for a command related thereto. The memory 630 may include the volatile memory 632 or the non-volatile memory 634.

The program 640 may be stored in the memory 630 as software, and may include, for example, an operating system (OS) 642, middleware 644, or an application 646.

The input device 650 may receive a command or data to be used by other component (e.g., the processor 620) of the electronic device 601, from the outside (e.g., a user) of the electronic device 601. The input device 650 may include, for example, a microphone, a mouse, or a keyboard.

The sound output device 655 may output sound signals to the outside of the electronic device 601. The sound output device 655 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 660 may visually provide information to the outside (e.g., a user) of the electronic device 601. The display device 660 may include, for example, a display, a hologram device, or a projector and control circuitry to control a corresponding one of the display, hologram device, and projector. According to one embodiment, the display device 660 may include touch circuitry adapted to detect a touch, or sensor circuitry (e.g., a pressure sensor) adapted to measure the intensity of force incurred by the touch.

The audio module 670 may convert a sound into an electrical signal and vice versa. According to one embodiment, the audio module 670 may obtain the sound via the input device 650, or output the sound via the sound output device 655 or a headphone of an external electronic device 602 directly (e.g., wired) or wirelessly coupled with the electronic device 601.

The sensor module 676 may detect an operational state (e.g., power or temperature) of the electronic device 601 or an environmental state (e.g., a state of a user) external to the electronic device 601, and then generate an electrical signal or data value corresponding to the detected state. The sensor module 676 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 677 may support one or more specified protocols to be used for the electronic device 601 to be coupled with the external electronic device 602 directly (e.g., wired) or wirelessly. According to one embodiment, the interface 677 may include, for example, a high definition multimedia interface (HDMI), a universal serial bus (USB) interface, a secure digital (SD) card interface, or an audio interface.

A connecting terminal 678 may include a connector via which the electronic device 601 may be physically connected with the external electronic device 602. According to one embodiment, the connecting terminal 678 may include, for example, an HDMI connector, a USB connector, an SD card connector, or an audio connector (e.g., a headphone connector).

The haptic module 679 may convert an electrical signal into a mechanical stimulus (e.g., a vibration or a movement) or an electrical stimulus which may be recognized by a user via tactile sensation or kinesthetic sensation. According to one embodiment, the haptic module 679 may include, for example, a motor, a piezoelectric element, or an electrical stimulator.

The camera module 680 may capture a still image or moving images. According to one embodiment, the camera module 680 may include one or more lenses, image sensors, image signal processors, or flashes.

The power management module 688 may manage power supplied to the electronic device 601. The power management module 688 may be implemented as at least part of, for example, a power management integrated circuit (PMIC).

The battery 689 may supply power to at least one component of the electronic device 601. According to one embodiment, the battery 689 may include, for example, a primary cell which is not rechargeable, a secondary cell which is rechargeable, or a fuel cell.

The communication module 690 may support establishing a direct (e.g., wired) communication channel or a wireless communication channel between the electronic device 601 and the external electronic device (e.g., the electronic device 602, the electronic device 604, or the server 608) and performing communication via the established communication channel. The communication module 690 may include one or more communication processors that are operable independently from the processor 620 (e.g., the AP) and supports a direct (e.g., wired) communication or a wireless communication. According to one embodiment, the communication module 690 may include a wireless communication module 692 (e.g., a cellular communication module, a short-range wireless communication module, or a global navigation satellite system (GNSS) communication module) or a wired communication module 694 (e.g., a local area network (LAN) communication module or a power line communication (PLC) module). A corresponding one of these communication modules may communicate with the external electronic device via the first network 698 (e.g., a short-range communication network, such as Bluetooth™, wireless-fidelity (Wi-Fi) direct, or a standard of the Infrared Data Association (IrDA)) or the second network 699 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 692 may identify and authenticate the electronic device 601 in a communication network, such as the first network 698 or the second network 699, using subscriber information (e.g., international mobile subscriber identity (IMSI)) stored in the subscriber identification module 696.

The antenna module 697 may transmit or receive a signal or power to or from the outside (e.g., the external electronic device) of the electronic device 601. According to one embodiment, the antenna module 697 may include one or more antennas, and, therefrom, at least one antenna appropriate for a communication scheme used in the communication network, such as the first network 698 or the second network 699, may be selected, for example, by the communication module 690 (e.g., the wireless communication module 692). The signal or the power may then be transmitted or received between the communication module 690 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 601 and the external electronic device 604 via the server 608 coupled with the second network 699. Each of the electronic devices 602 and 604 may be a device of a same type as, or a different type, from the electronic device 601. All or some of operations to be executed at the electronic device 601 may be executed at one or more of the external electronic devices 602, 604, or 608. For example, if the electronic device 601 should perform a function or a service automatically, or in response to a request from a user or another device, the electronic device 601, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 601. The electronic device 601 may provide the outcome, with or without further processing of the outcome, as at least part of a reply to the request. To that end, a cloud computing, distributed computing, or client-server computing technology may be used, for example.

One embodiment may be implemented as software (e.g., the program 640) including one or more instructions that are stored in a storage medium (e.g., internal memory 636 or external memory 638) that is readable by a machine (e.g., the electronic device 601). For example, a processor of the electronic device 601 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An electronic device, comprising:

a first dielectric layer;

a metal patterned in the first dielectric layer;

a second dielectric layer deposited directly on the first dielectric layer; and a metal via deposited in a channel in the second dielectric layer, the metal via being in contact with the patterned metal in the first dielectric layer, wherein the second dielectric layer includes a nanowall formed on the metal in the first dielectric layer, and the channel spans from a top surface of the second electric layer to a bottom surface of the second dielectric layer; and wherein the channel is formed by removing a portion of the nanowall.

2. The electronic device of claim 1, wherein the nanowall comprises a dielectric nanowall.

3. The electronic device of claim 2, further comprising a third dielectric layer deposited on the second dielectric layer and the dielectric nanowall.

4. The electronic device of claim 3, further comprising a space etched in the third dielectric layer above the dielectric nanowall.

5. The electronic device of claim 4, wherein the metal via is deposited in the space in the third dielectric layer.

6. The electronic device of claim 3, further comprising a metal layer deposited on the third dielectric layer.

7. The electronic device of claim 2, wherein the nanowall is formed by way of vapor-liquid-solid (VLS) growth.

8. The electronic device of claim 2, wherein the nanowall comprises a semiconductor nanowall.

9. The electronic device of claim 8, wherein the semiconductor nanowall is Si-based or Ge-based.

10. The electronic device of claim 8, further comprising a dielectric material deposited in the channel.

11. The electronic device of claim 10, wherein the dielectric material comprises SiN.

12. The electronic device of claim 10, further comprising a third dielectric layer deposited on the second dielectric layer and over the dielectric material in the channel.

13. The electronic device of claim 12, further comprising a space etched in the third dielectric layer above the dielectric material.

14. The electronic device of claim 13, wherein the metal via is deposited in the channel after the dielectric material in the channel is selectively etched away.

* * * * *